(12) United States Patent
Quan et al.

(10) Patent No.: US 8,140,026 B2
(45) Date of Patent: Mar. 20, 2012

(54) ALL-DIGITAL SELECTABLE DUTY CYCLE GENERATION

(75) Inventors: Xiaohong Quan, San Diego, CA (US);
Lennart K. Mathe, San Diego, CA (US); Liang Dai, San Diego, CA (US);
Dinesh J. Alladi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 406 days.

(21) Appl. No.: 12/436,288

(22) Filed: May 6, 2009

(65) Prior Publication Data

US 2010/0283522 A1    Nov. 11, 2010

(51) Int. Cl.
*H03K 7/08* (2006.01)
*H03K 5/156* (2006.01)
(52) U.S. Cl. .......................................... 455/76; 327/176
(58) Field of Classification Search .................... 455/76; 327/176

See application file for complete search history.

(56) References Cited

U.S. PATENT DOCUMENTS

| 4,803,437 | A |   | 2/1989 | Reusens |          |
|-----------|---|---|--------|---------|----------|
| 4,870,665 | A | * | 9/1989 | Vaughn  | 327/114  |
| 5,402,009 | A | * | 3/1995 | Kiyota  | 327/176  |

FOREIGN PATENT DOCUMENTS

| EP | 1986070  | 10/2008 |
|----|----------|---------|
| JP | 4200111  | 7/1992  |

OTHER PUBLICATIONS

International Search Report and Written Opinion—PCT/US2010/033947, International Search Authority—European Patent Office—Jul. 21, 2010.

\* cited by examiner

*Primary Examiner* — Joseph Chang
(74) *Attorney, Agent, or Firm* — Eric Ho

(57) ABSTRACT

All-digital techniques for generating periodic digital signals having selectable duty cycles. In one aspect, a computation block is provided for computing the product of a selected duty cycle and a discrete ratio between a reference clock period and a high-frequency oscillator period. The computation block may be coupled to a pulse width generator for generating signals having pulse widths that are integer multiples of the high-frequency oscillator period. In another aspect, a pulse width generator may also accommodate mixed fractional multiples of high-frequency oscillator periods by tapping the individual inverter stages of a delay line matched to the individual inverter stages of a ring oscillator exemplary embodiment of the high-frequency oscillator.

26 Claims, 11 Drawing Sheets

ALL-DIGITAL SELECTABLE DUTY CYCLE GENERATION

TECHNICAL FIELD

The disclosure relates to digital circuit design, and more particularly, to all-digital techniques for generating periodic signals having selectable duty cycles.

BACKGROUND

Certain applications in electronic circuit design call for the generation of periodic digital signals having selectively controllable duty cycles. Conventional techniques for generating such selectable duty cycle signals may include coupling a reference oscillator signal to one or more analog components. In all-digital circuits, e.g., all-digital phase locked loops (AD-PLL's), the use of such analog components may not be suitable.

It would be desirable to provide all-digital techniques for generating periodic digital signals having precisely controllable duty cycles.

SUMMARY

An aspect of the present disclosure provides an apparatus for generating a periodic digital signal having a selectable duty cycle from a reference signal and an oscillator signal, the oscillator signal having a period shorter than that of the reference signal, the apparatus comprising: a computation block configured to determine a computed target cycle count, the computed target cycle count corresponding to the result of multiplying a selected duty cycle with a ratio between the periods of the reference signal and the oscillator signal; and a pulse width generator configured to generate an output signal having a pulse width corresponding to the computed target cycle count times the period of the oscillator signal.

Another aspect of the present disclosure provides a method for generating a periodic digital signal having a selectable duty cycle from a reference signal and an oscillator signal, the oscillator signal having a period shorter than that of the reference signal, the method comprising: computing a target cycle count, the computed target cycle count corresponding to the result of multiplying a selected duty cycle with a ratio between the periods of the reference signal and the oscillator signal; and generate a periodic output signal having a pulse width corresponding to the computed target cycle count times the period of the oscillator signal.

Yet another aspect of the present disclosure provides an apparatus for generating a periodic digital signal having a selectable duty cycle from a reference signal and an oscillator signal, the oscillator signal having a period shorter that of the reference signal, the apparatus comprising: means for computing a target cycle count, the computed target cycle count corresponding to the result of multiplying a selected duty cycle with a ratio between the periods of the reference signal and the oscillator signal; and means for generating a periodic output signal having a pulse width corresponding to the computed target cycle count times the period of the oscillator signal.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX LO and RX LO signal generator comprising a variable duty cycle generator for generating a signal having a selectable duty cycle from a reference signal and an oscillator signal, the oscillator signal having a period shorter than that of the reference signal, the duty cycle generator comprising: a computation block configured to determine a computed target cycle count, the computed target cycle count corresponding to the result of multiplying a selected duty cycle with a ratio between the periods of the reference signal and the oscillator signal; and a pulse width generator configured to generate an output signal having a pulse width corresponding to the computed target cycle count times the period of the oscillator signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
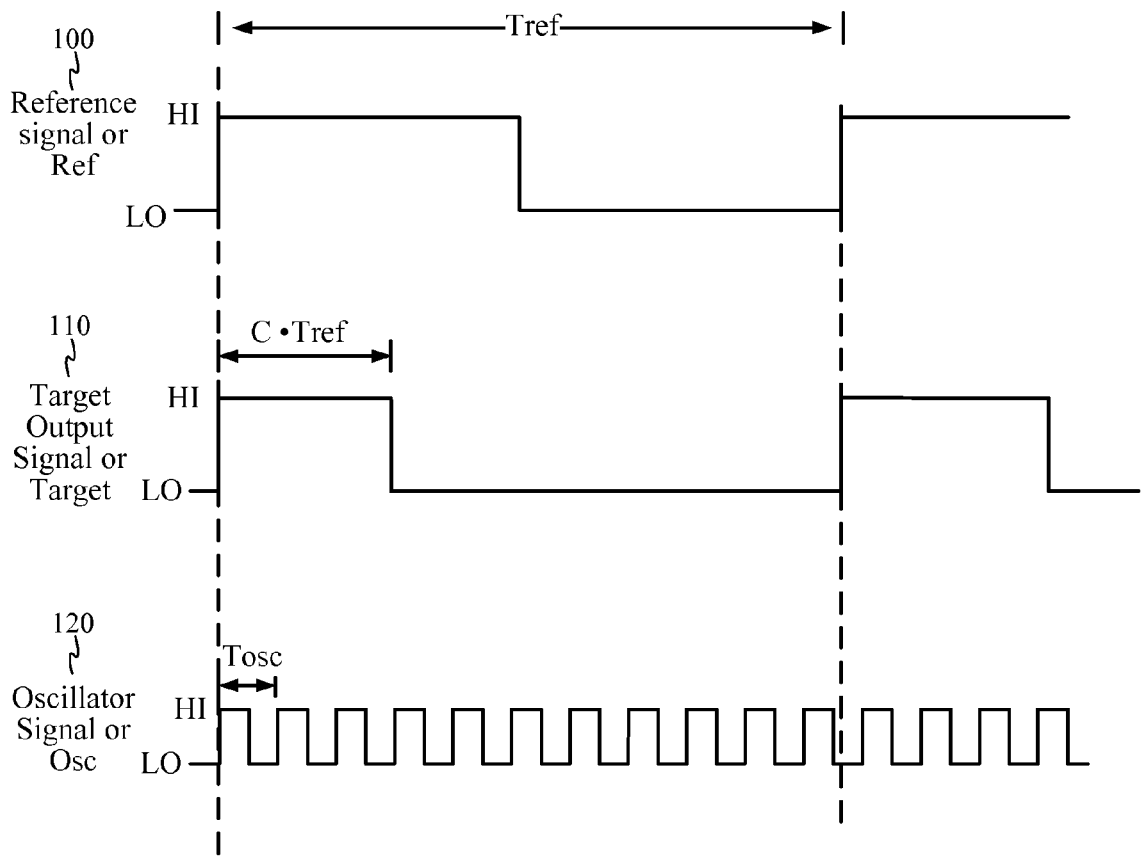
FIG. 1 illustrates signals and terminology that will be used herein to describe the principles of the present disclosure.

FIG. 1 illustrates signals and terminology that will be used herein to describe the principles of the present disclosure.

In FIG. 1, a periodic Reference Signal, or Ref 100, is shown. Ref 100 has a cycle duration, or period, of Tref. Given Ref 100, it is desired to generate a periodic Target Output Signal, or Target 110, also having a period of Tref, but with a controlled pulse width of C·Tref, wherein C represents the duty cycle and is generally less than 1. For example, when C=50%, the Target Output Signal may be a logical HIGH output for 50% of the cycle and a logical LOW output for the other 50% of the cycle.

Note that while the term "duty cycle" as used herein refers to the portion of a signal cycle during which a signal is a logical HIGH compared to the duration of the entire signal cycle, and such convention is adopted herein in this disclosure unless otherwise noted, one of ordinary skill in the art will appreciate that the principles of the present disclosure may readily be applied to systems adopting other conventions. For example, alternative exemplary embodiments may reference "duty cycle" to the portion of a signal cycle during which a signal is a logical LOW. Alternatively, the definition of "duty cycle" may be based on an arbitrarily specified portion of the cycle of any periodic signal. Such alternative exemplary embodiments are contemplated to be within the scope of the present disclosure.

Referring again to FIG. 1, to aid in the generation of Target 110, a periodic Oscillator Signal, or Osc 120, having a period Tosc is provided. As shown in FIG. 1, the period Tosc of Osc 120 is generally less than the period Tref of Ref 100, i.e., Ref 100 has a lower frequency than Osc 120. In this specification and in the claims, the ratio of Tref versus Tosc is denoted as L, i.e., Tref=L·Tosc. Note as the period Tref need not be an integer multiple of the period Tosc, L may generally include a non-zero fractional portion.

According to the present disclosure, all-digital techniques for generating a signal Target 110 having a selectable duty cycle C from the signals Ref 100 and Osc 120 are described.

Figure 2:
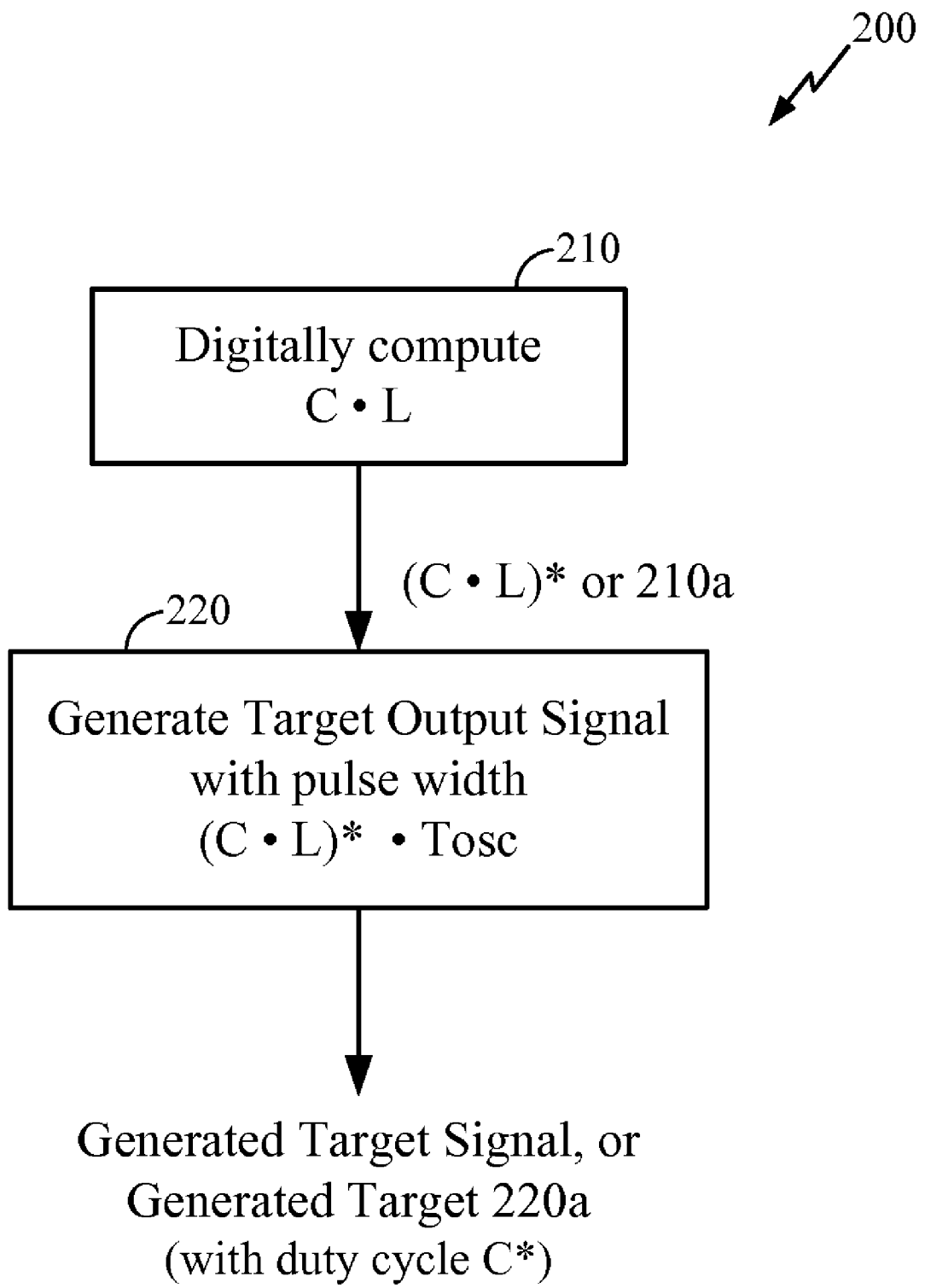
FIG. 2 illustrates an exemplary embodiment of a method or block diagram according to the present disclosure.

FIG. 2 illustrates an exemplary embodiment 200 of a method or block diagram according to the present disclosure.

At block 210, the value of C·L is digitally computed, wherein C is selected based on the requirements, and L is obtained via some computation, e.g., using computational techniques such as described later herein. It will be appreciated that the quantity C·L may also be interpreted as the number of cycles of Osc 120 elapsing in the interval during which Target 110 is HIGH. As previously mentioned, the value of L may generally include a non-zero fractional portion, and thus a digital computation of C·L may have only finite precision due to e.g., numerical quantization of L.

Block 210 digitally computes a value for C·L that is denoted herein as the computed target cycle count (C·L)*, or 210a, wherein the notation (·)* generally indicates a computed version of the quantity marked by the asterisk.

At block 220, given the computed target cycle count (C·L)* from block 210, an output signal is generated having period Tref and pulse width (C·L)*·Tosc. The output signal of block 220 is denoted as the Generated Target Output Signal or Generated Target 220a. Generated Target 220a has a duty cycle C* that approximates the selected duty cycle C.

In an exemplary embodiment, block 210 may be executed during initialization and/or calibration phases of the duty cycle generator 200, while block 220 may be executed during every cycle of Ref 100 to produce the Generated Target 220a.

Figure 3:
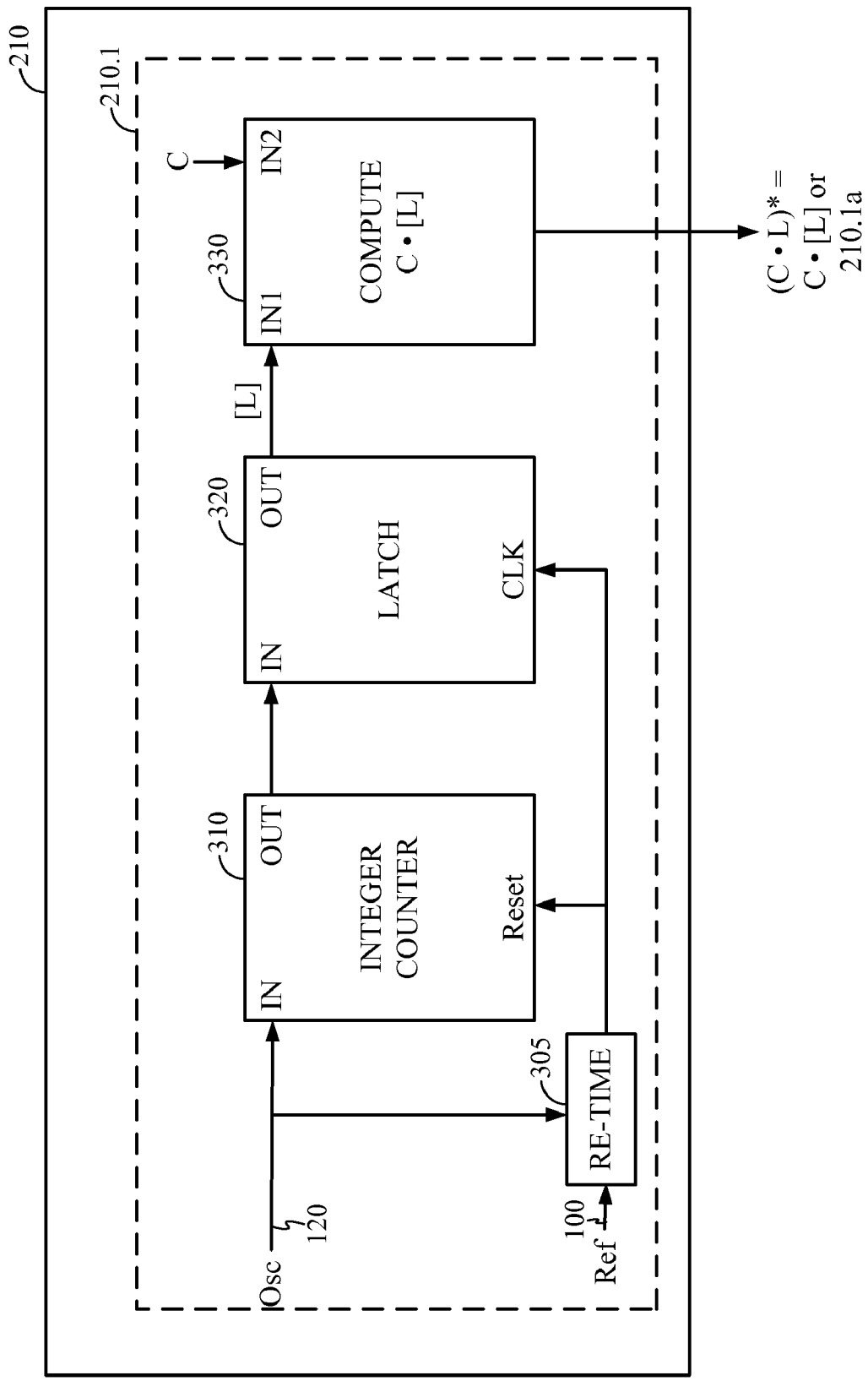
FIG. 3 illustrates an exemplary embodiment of a computation mechanism for implementing the operations shown in FIG. 2.

FIG. 3 illustrates an exemplary embodiment 210.1 of a computation mechanism for implementing the operations shown at block 210 in FIG. 2.

In FIG. 3, an integer counter 310 counts the number of rising edges detected in Osc 120, and generates the counted number at its output OUT. The counter 310 is reset, e.g., OUT is reset to zero, by a rising edge detected in a re-timed version of Ref 100. The retiming block 305 may be provided to realign Ref 100 relative to Osc 120 to ensure that Ref 100 and Osc 120 are synchronized with each other.

The output of the counter 310 is coupled to the latch 320. The latch 320 is configured to latch the output of the counter 310 on the rising edge of Ref 100. Note the depicted configuration of counter 310 and latch 320 effectively counts the number of rising edges of Osc 120 elapsing in one cycle of Ref 100, i.e., between two rising edges of Ref 100. The counted number may be expressed as [L], wherein the notation [x] as used herein denotes the maximum integer less than the value x shown in brackets.

Based on the preceding description, one of ordinary skill in the art will appreciate that the timing characteristics of counter 310 and latch 320 should be such that the output of counter 310 is latched by the latch 320 prior to the counter 310 being reset by the rising edge of Ref 100.

One of ordinary skill in the art will appreciate that while certain exemplary embodiments described herein may specifically refer to "rising" or "falling" edges of signals, alternative exemplary embodiments utilizing reverse or differing conventions for the signal edges, or any other detectable periodic events in the referenced signals, are readily derivable in light of the present disclosure. Such alternative exemplary embodiments are contemplated to be within the scope of the present disclosure.

One of ordinary skill in the art will further appreciate that while the integer counter 310 has been described as having an output reset based on a rising edge detected at its Reset input, alternative exemplary embodiments may readily employ counters having different functional specifications. For example, in an alternative exemplary embodiment (see, e.g., counter 940 in FIG. 9), an integer counter may be configured to start counting (from zero) upon a falling (or rising) edge detected at a Reset-S input, and to stop counting upon a rising (or falling) edge detected at the Reset-S input. Such an alternative exemplary embodiment may, e.g., advantageously reduce any edge counting error attributable to the finite time needed to start and/or stop the counter. Note in such an alternative exemplary embodiment, Ref 100 may be divided down in frequency by a factor of two prior to being provided to the Reset-S input, so that the start-stop counting interval duration is kept the same as for the exemplary embodiment shown in FIG. 3. Such an alternative exemplary embodiment is contemplated to be within the scope of the present disclosure.

Referring again to FIG. 3, the output [L] of the latch 320 is provided to a computation block 330, which digitally multiplies the computed quantity [L] with the selected duty cycle C to obtain an estimate (C·L)* of C·L as C·[L]. The value C·[L] is output as signal 210.1a of block 210.1.

One of ordinary skill in the art will appreciate that the computation block 330 may be implemented in various ways. In an exemplary embodiment, a simple digital multiplier may be used to multiply C with [L].

Figure 4:
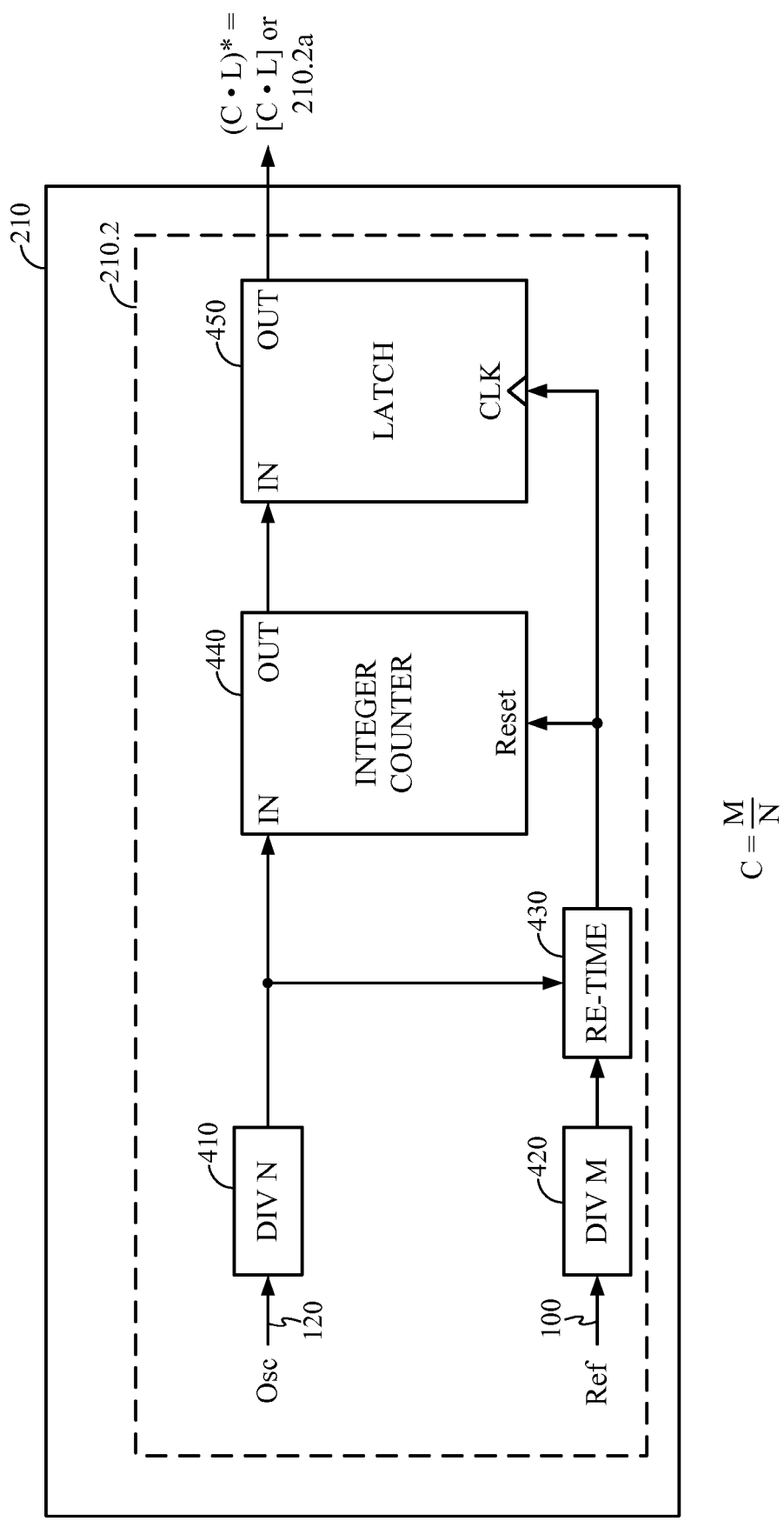
FIG. 4 illustrates an alternative exemplary embodiment of a computation mechanism for implementing the operations shown in FIG. 2.

FIG. 4 illustrates an alternative exemplary embodiment 210.2 of a computation mechanism for implementing the operations shown at block 210 in FIG. 2.

In FIG. 4, a divide-by-N block 410 divides the frequency of Osc 120 down by an integer factor N. Similarly, a divide-by-M block 420 divides the frequency of Ref 100 down by an integer factor M. In an exemplary embodiment, the integers N and M may be chosen such that the ratio M/N corresponds to a selected duty cycle C. A retiming block 430 may be provided to realign the M-divided version of Ref 100 relative to the N-divided version of Osc 120 to ensure that the divided versions of Ref 100 and Osc 120 are synchronized with each other.

An integer counter 440 counts the number of rising edges detected in the N-divided version of Osc 120. The counter 440 is reset by a rising edge detected in the re-timed M-divided version of Ref 100. A latch 450 is configured to latch the output of the counter 440 on the rising edge of the re-timed M-divided version of Ref 100.

Based on the preceding description, it will be appreciated that the block 210.2 effectively counts the number of rising edges of an N-divided version of Osc 120 occurring in one cycle of an M-divided version of Ref 100. The number counted may thus be expressed as [(M/N)·L], or [C·L], which is provided as the output 210.2a of block 210.2.

Figure 5:
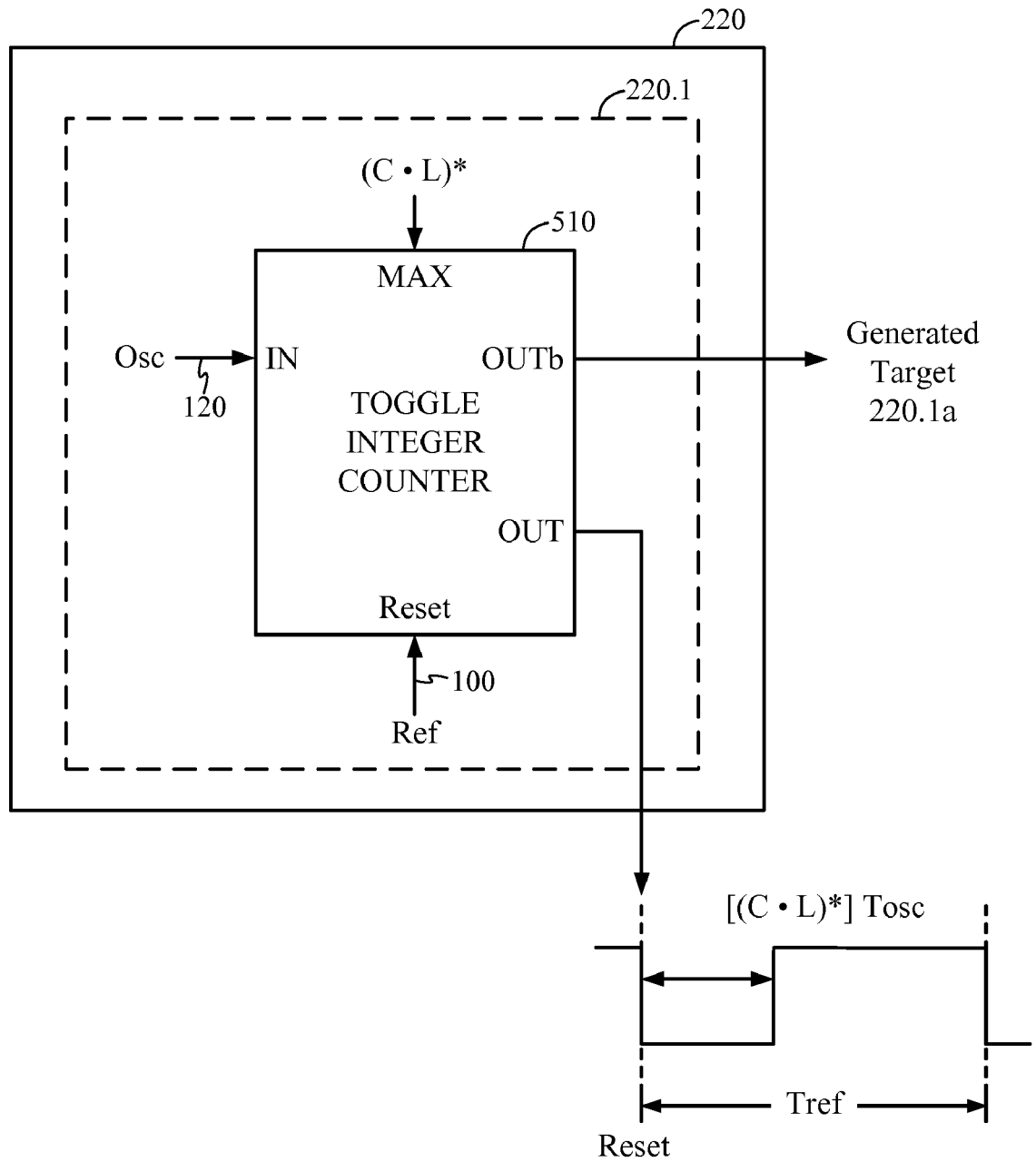
FIG. 5 illustrates an exemplary embodiment of a pulse width generation mechanism for implementing the operations shown in FIG. 2.

FIG. 5 illustrates an exemplary embodiment 220.1 of a pulse width generation mechanism for implementing the operations shown at block 220 in FIG. 2.

In FIG. 5, a toggle integer counter 510 is provided. On a rising edge detected in Ref 100, the output OUT of toggle integer counter 510 is reset to LOW, and the complementary output OUTb is reset to HIGH. The toggle integer counter 510 thereafter counts the number of rising edges detected in Osc 120, and switches the output OUT from LOW to HIGH when the number of detected rising edges reaches the value (C·L)* provided to the MAX input. Thus it will be appreciated that the interval during which the OUT signal is LOW starts from a rising edge in Ref 100 and continues for a duration [(C·L)*]·Tosc thereafter, whereupon the output OUT of toggle integer counter 510 switches to HIGH for the remainder of the period Tref. The complementary output OUTb of toggle integer counter 510 correspondingly transitions from HIGH to LOW upon the prespecified number of rising edges being detected, and thus may be made available as the Generated Target 220.1a having a duty cycle C* that approximates the duty cycle C.

Figure 6:
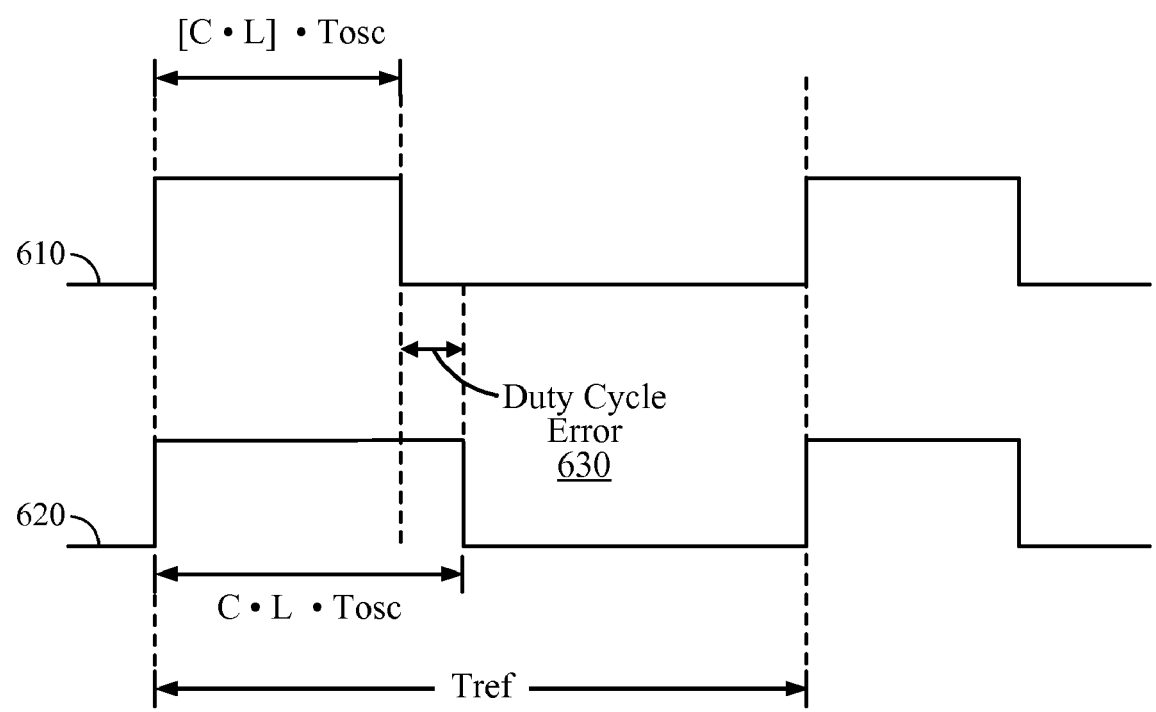
FIG. 6 illustrates the duty cycle error that may be present in a generated target output signal.

While the techniques described above allow all-digital generation of a signal having duty cycle C*, it will be appreciated that in general a discrepancy may exist between the selected duty cycle C and the actual duty cycle C* due to, e.g., quantization of L or C·L in the computation of (C·L)*. FIG. 6 illustrates the duty cycle error that may be present in a generated target output signal. In FIG. 6, a generated target output signal 610 is shown. According to the present disclosure, signal 610 may be generated, e.g., using the block 210.2 coupled with the block 220.1 to produce a Generated Target 220a. Signal 610 is shown in comparison with an ideal target output signal 620 having a duty cycle that is exactly C. A duty cycle error 630 is seen to be present in the duty cycle of target output signal 610.

Further techniques are disclosed hereinbelow for generating signals that reduce the duty cycle error 630.

Figure 7:
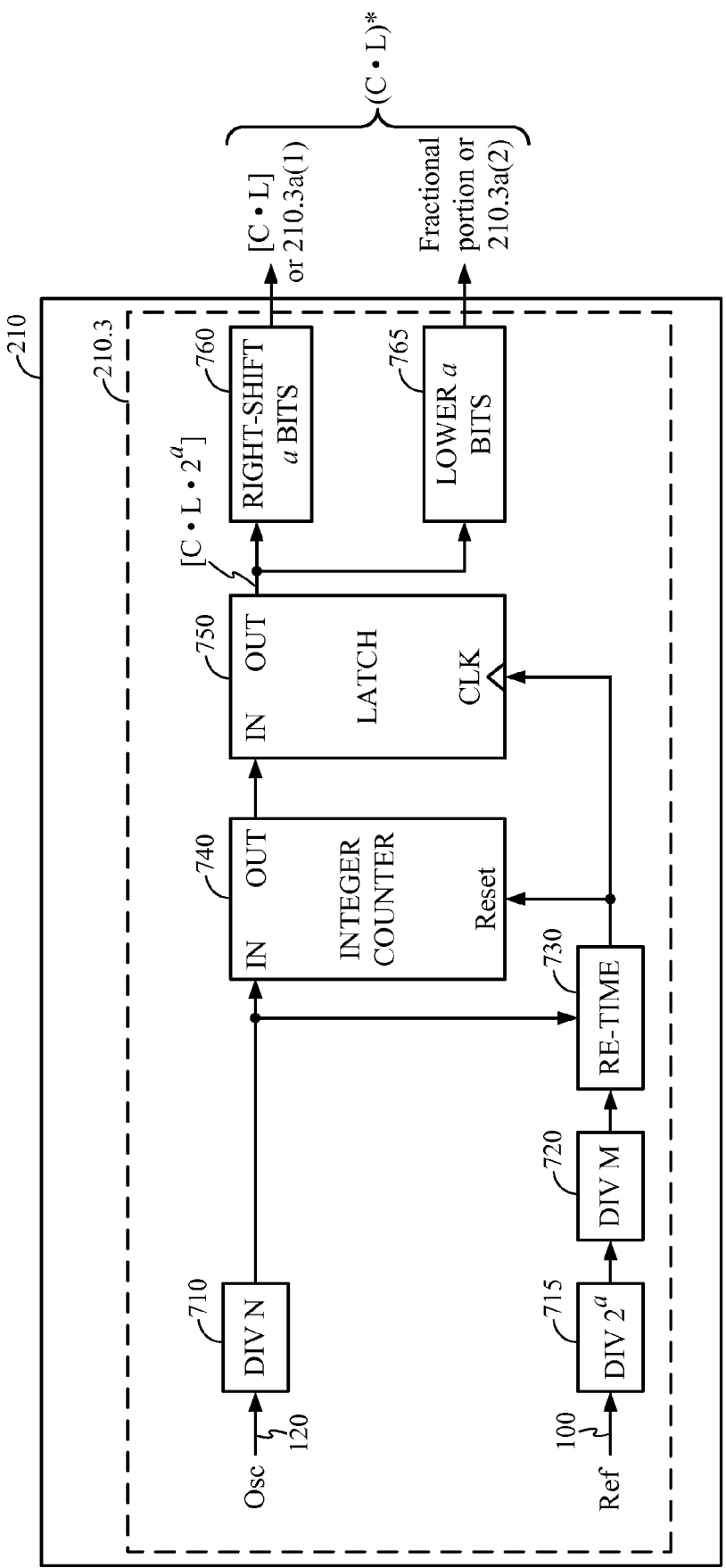
FIG. 7 illustrates an alternative exemplary embodiment of a mechanism for implementing the operations shown in FIG. 2.

FIG. 7 illustrates an alternative exemplary embodiment 210.3 of a computation mechanism for implementing the operations shown at block 210 in FIG. 2. The block 210.3 computes both an integer portion [C·L], or 210.3a(1), and a fractional portion, or 210.3a(2), of the estimate (C·L)*. In particular, the availability of the fractional portion 210.3a(2) may advantageously be used to reduce the duty cycle error of a subsequently generated signal, as further described hereinbelow.

In FIG. 7, in addition to the divide-by-M block 720, Ref 100 is further coupled to a divide-by-$2^a$ block 715 prior to being supplied to the re-timing block 730, wherein $2^a$ refers to 2 raised to the a-th power, and a is an integer. Ref 100 is thus seen to be divided down in frequency by a composite factor of M·$2^a$ prior to being supplied to the re-timing block 730. Similar to the embodiment 210.2, an integer counter 740 is provided to count the number of rising edges in the N-divided version of Osc 120. However, the integer counter 740 is reset by the re-timed M·$2^a$-divided version of Ref 100.

A latch 750 is configured to latch the output of the counter 740 on the rising edge of the re-timed M·$2^a$-divided version of Ref 100. In light of the previous description of exemplary embodiment 210.2, the sampled output of latch 750 corresponds to the quantity [C·L·$2^a$].

One of ordinary skill in the art will appreciate that while frequency division of Ref 100 in FIG. 7 is shown as implemented using two dividers 715 and 720, the same division may be achieved using only one divider producing a composite division factor of M·$2^a$, or any other combination of dividers producing the same composite division factor. Furthermore, the sequencing of any dividers may readily be changed from what is shown in FIG. 7. Such alternative exemplary embodiments are contemplated to be within the scope of the present disclosure.

The output [C·L·$2^a$] of latch 750 is right-shifted by a bits using block 760 to generate the output [C·L], or 210.3a(1). One of ordinary skill in the art will appreciate that the operation of right-shifting the binary value of [C·L·$2^a$] by a bits corresponds to dividing [C·L·$2^a$] by $2^a$, and retaining only the integer portion. On the other hand, the lower a bits of the output [C·L·$2^a$], as extracted by block 765, correspond to the fractional portion 210.3a(2) of [C·L·$2^a$].

Figure 8:
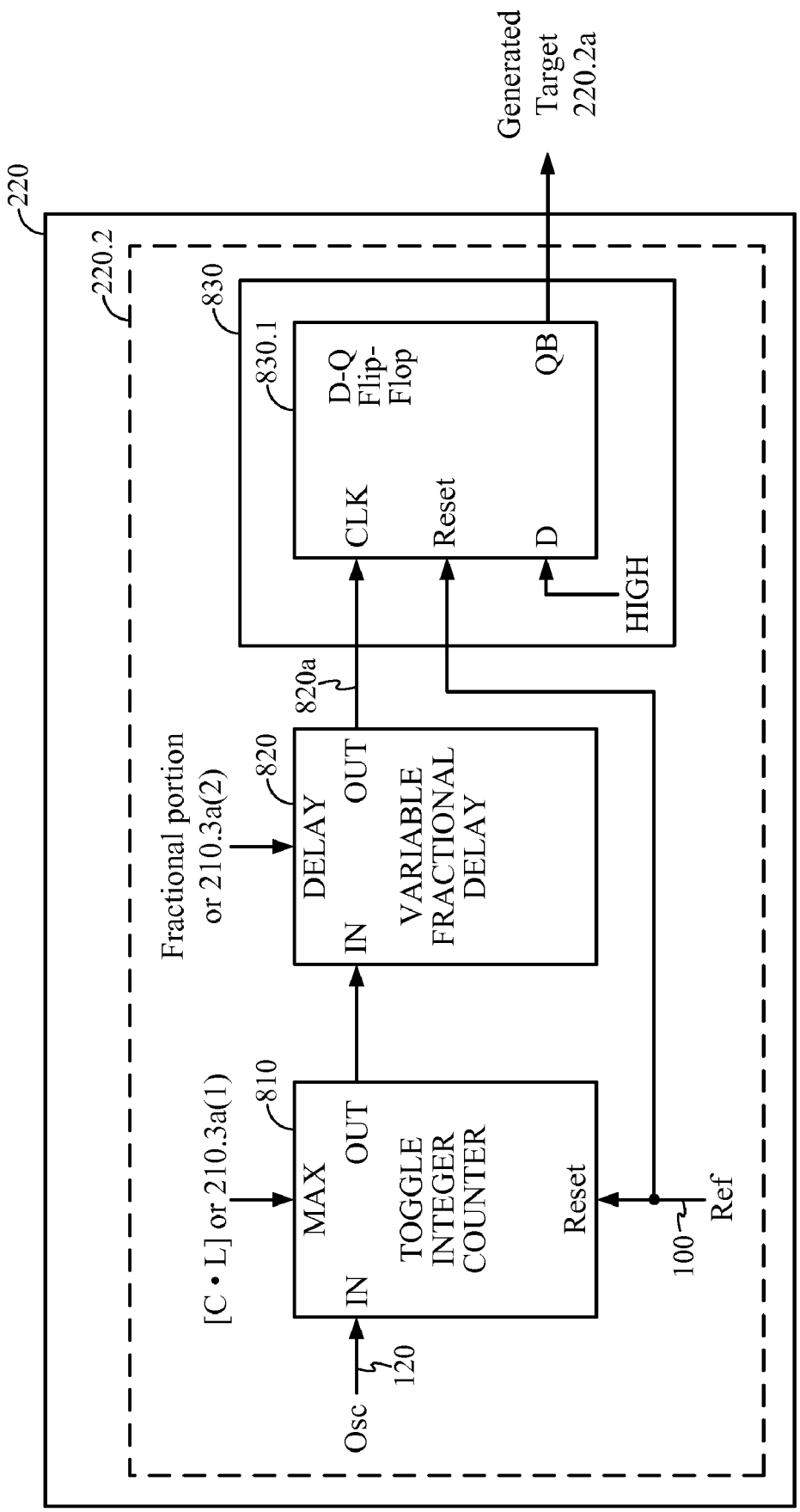
FIG. 8 illustrates an exemplary embodiment of a pulse width generation mechanism that is capable of utilizing a computed fractional portion of $(C \cdot L)^*$ to reduce the duty cycle error.

FIG. 8 illustrates an exemplary embodiment 220.2 of a pulse generation mechanism that is capable of utilizing a computed fractional portion of (C·L)* to reduce the duty cycle error. In an exemplary embodiment, the fractional portion 210.3a(2) generated by block 210.3 may be utilized as the computed fractional portion, although one of ordinary skill in the art will appreciate that block 220.2 need not be used in conjunction with the block 210.3, and block 220.2 may generally utilize integer and fractional portions of (C·L)* computed in any manner derivable by one of ordinary skill in the art in light of the present disclosure.

In FIG. 8, a toggle integer counter 810 is provided. On a rising edge detected in Ref 100, the output OUT of toggle integer counter 810 is reset to LOW. The toggle integer counter 810 counts the number of rising edges detected in Osc 120, and switches the output OUT from LOW to HIGH when the number of rising edges detected reaches the value [C·L] provided to the MAX input. In an exemplary embodiment, the value provided to the MAX input may be derived from, e.g., signal 210.3a(1) of block 210.3. The OUT signal of the toggle integer counter 810 thus has a LOW pulse width of [C·L]·Tosc.

The OUT signal of toggle integer counter 830 is provided to the input IN of a variable fractional delay unit 820. The variable fractional delay unit 820 is capable of delaying the signal at its input IN by a fractional portion of a cycle of Osc 120, wherein the value of the fractional portion is coupled to the delay unit 820's DELAY input. In the exemplary embodiment shown, the delay unit 820's DELAY input may be coupled to the output of a fractional portion computation block, such as signal 210.3a(2) from block 210.3. The output of the variable fractional delay unit 820 is denoted as 820a.

One of ordinary skill in the art will appreciate that there are various techniques for implementing a variable fractional delay unit capable of delaying a signal by a fractional portion of a cycle of Osc 120. In an exemplary embodiment wherein Osc 120 is generated by a ring oscillator, e.g., wherein Osc 120 is generated by an odd number of inverter stages cyclically coupled in series, the variable fractional delay unit 820 may be implemented using a plurality of inverter stages (not shown) that are physically matched (e.g., in layout, dimensions, etc.) to the inverter stages of the ring oscillator. This advantageously allows the delays generated by the variable fractional delay unit 820 to be closely matched to the same delays used to generate Osc 120, and thus a unit fractional delay of the variable fractional delay unit 820 may closely correspond to an exact sub-multiple of the period Tosc.

The signal 820a is supplied to the input of a pulse aggregator 830 for generating a signal having pulse width $[C \cdot L \cdot 2^a]/2^a$ and period Tref from the signals Ref 100 and 820a. In the exemplary embodiment shown, the pulse aggregator 830 includes a D-Q flip-flop 830.1 having a CLK input coupled to the signal 820a. On a rising edge of Ref 100, a Q output (not shown) of the D-Q flip-flop 830 is reset to LOW, while the QB complementary output is reset to HIGH. On the rising edge of 820a, the static HIGH at the D input of D-Q flip-flop 830.1 is sampled, causing the signal at the complementary output QB to transition to LOW. One of ordinary skill in the art will appreciate that the signal at the output QB has a pulse width of $Tosc \cdot [C \cdot L \cdot 2^a]/2^a$, which is a closer approximation to the desired pulse width of $C \cdot L \cdot Tosc$ than $[C \cdot L] \cdot Tosc$. The output QB of D-Q flip-flop 830.1 may be made available as the Generated Target 220.2a.

Note one of ordinary skill in the art of digital logic design may readily derive alternative implementations (not shown) for performing the function of the pulse aggregator 830. Such alternative exemplary embodiments are contemplated to be within the scope of the present disclosure.

Figure 9:
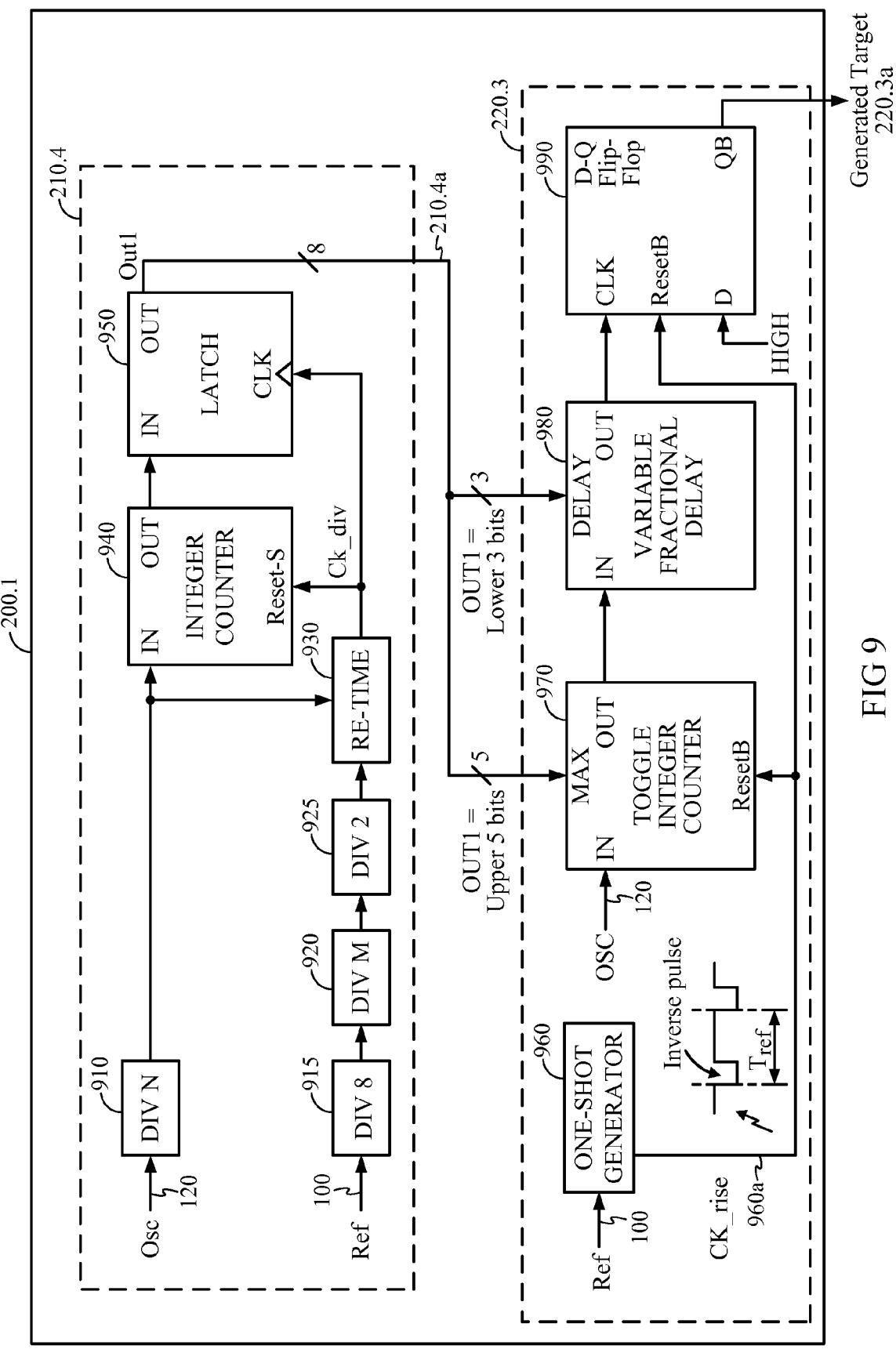
FIG. 9 illustrates an alternative exemplary embodiment of a selectable duty cycle generator according to the present disclosure.

FIG. 9 illustrates an alternative exemplary embodiment 200.1 of a selectable duty cycle generator according to the present disclosure. The duty cycle generator 200.1 includes a computation block 210.4 for computing a target value $(C \cdot L)^*$ or 210.4a, and a pulse width generator 220.3 for generating a signal having a pre-specified pulse width. Note the duty cycle generator 200.1 is described for illustrative purposes only, and is not meant to limit the scope of the present disclosure.

In FIG. 9, computation block 210.4 includes a counter 940 configured to start counting, on a falling edge of a signal Ck_div detected at the Reset-S input, the number of rising edges detected in the N-divided version of Osc 120. Ck_div corresponds to the re-timed divided version of Ref 100. Counter 940 is further configured to stop counting rising edges on a rising edge of Ck_div. As previously mentioned, the use of falling and rising edges of Ck_div to start and stop the integer counter 940 may advantageously reduce any edge counting error attributable to the finite time needed to start and/or stop the counter.

A latch 950 latches the output of counter 940 on the rising edge of Ck_div to generate the signal Out1, or 210.4a. In the exemplary embodiment shown, Out1 is represented by 8 bits of precision. Note the bitwidths of signals described herein are given for illustrative purposes only, and are not meant to limit the scope of the present disclosure.

Note to maintain the start-stop counting interval at Tref, a divide-by-two block 925 is provided to divide down the frequency of Ref 100 by a further factor of two, in addition to the frequency dividers 915 and 920 whose functions have been earlier described herein with reference to FIG. 7. Note also that the divide-by-8 block 915 effectively allows computation of 3 fractional bits (i.e., a=3) for $(C \cdot L)^*$, in accordance with the principles earlier described herein with reference to FIG. 7.

Pulse width generator 220.3 includes a toggle integer counter 970 and a variable fractional delay unit 980 configured to accept the upper 5 bits and lower 3 bits, respectively, of the 8-bit signal Out1, in accordance with the principles earlier described herein with reference to FIG. 8.

Pulse width generator 220.3 further includes a one-shot generator 960, which generates a single inverse pulse Ck_rise, or 960a, having falling edges that correspond to the rising edges of Ref 100. The one-shot generator 960 may be advantageously provided in exemplary embodiments wherein devices such as DQ flip-flop 990 require a pulse or inverse pulse having a sufficiently long pulse width supplied to its ResetB (i.e., complementary Reset) input to properly reset their outputs, but also a sufficiently short pulse width to minimize any delay introduced in sampling the input signal.

The toggle integer counter 970 is configured to start counting on the falling edge of Ck_rise, and to generate a pulse at its output OUT having LOW pulse width corresponding to the upper 5 bits of Out1. The variable fractional delay unit 980 is configured to delay the output OUT of toggle integer counter 970 by a fractional delay corresponding to the lower 3 bits of Out1. The D-Q flip-flop 990 is configured to reset its QB output to a logical HIGH on the falling edge of Ck_rise. Based on the principles previously described herein, the QB output of flip-flop 990 will transition from HIGH to LOW when a rising edge is detected in the output OUT of variable fractional delay unit 980. The QB output of D-Q flip-flop 990 may be supplied as the Generated Target 220.3a.

In an exemplary embodiment, the delay of the variable fractional delay unit 980 may be extended beyond what is programmed at its DELAY input to compensate for, e.g., any undesirable reductions in the pulse width of Generated Target 220.3a due to system delays. For example, the variable fractional delay unit 980 may extend the delay corresponding to the lower 3 bits of Out1 by an "extended compensation delay" corresponding to the LOW pulse width of the signal Ck_rise. This may advantageously compensate for any undesirable reduction in the pulse width of Generated Target 220.3a due, e.g., to a finite delay in resetting the toggle integer counter 970. Note the extended compensation delay may be implemented by, e.g., providing additional inverter stages in the variable fractional delay unit 980.

Figure 10:
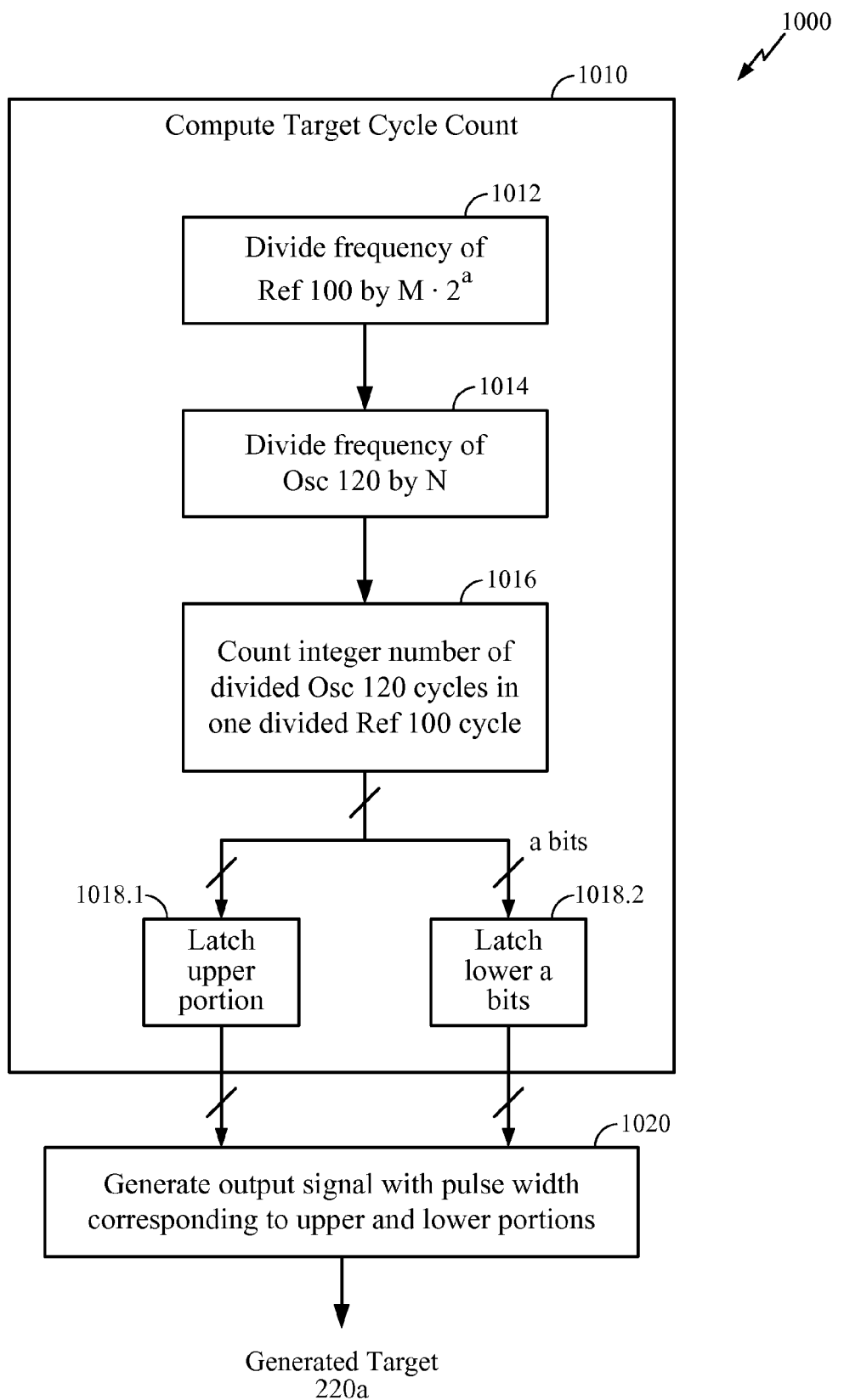
FIG. 10 illustrates an exemplary embodiment of a method according to the present disclosure.

FIG. 10 illustrates an exemplary embodiment 1000 of a method according to the present disclosure. Note the method 1000 is shown for illustrative purposes only, and is not meant to restrict the scope of the present disclosure.

In FIG. 10, at block 1010, a target cycle count is computed. In the method shown, block 1010 may further include blocks 1012-1018, as further described hereinbelow.

At block 1012, the frequency of Ref 100 is divided by $M \cdot 2^a$ to generate a divided reference signal.

At block 1014, the frequency of Osc 120 is divided by a second integer to generate a divided oscillator signal.

At block 1016, an integer number of cycles elapsing in the divided oscillator signal during one period of the divided reference signal is counted.

At block 1018, the integer number of cycles counted is latched, with an upper bit portion of the latched number corresponding to the integer portion of the computed target cycle count, and a lower bit portion of the latched number corresponding to the fractional portion of the computed target cycle count.

At block 1020, an output signal having a pulse width corresponding to the computed target cycle count times the period of the oscillator signal is generated. The output of block 1020 is the Generated Target 220a.

Figure 11:
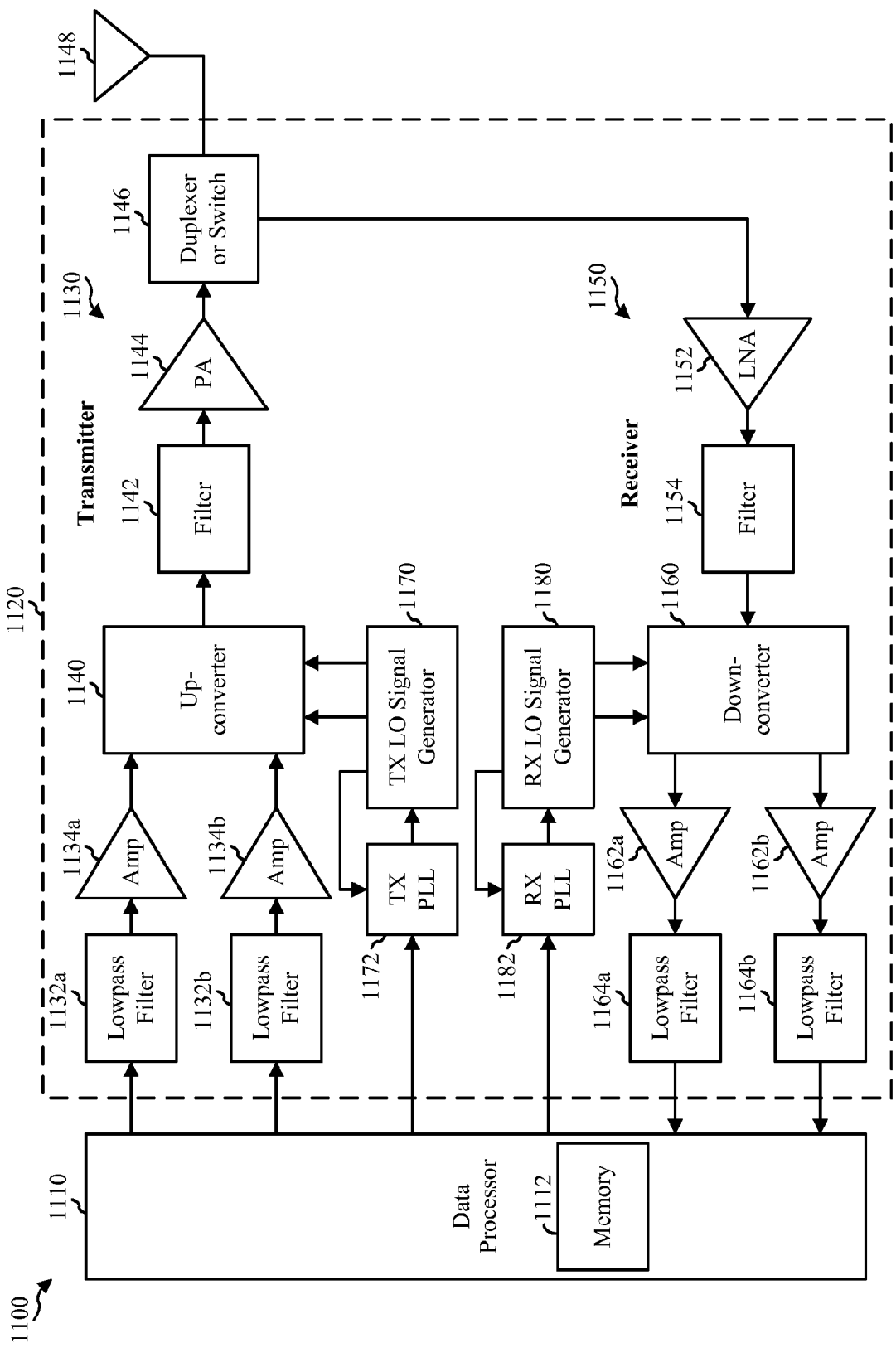
FIG. 11 illustrates a block diagram of a design of a wireless communication device in which the techniques of the present disclosure may be implemented.

FIG. 11 illustrates a block diagram of a design of a wireless communication device 1100 in which the techniques of the present disclosure may be implemented. In the design shown in FIG. 11, wireless device 1100 includes a transceiver 1120 and a data processor 1110 having a memory 1112 to store data and program codes. Transceiver 1120 includes a transmitter 1130 and a receiver 1150 that support bi-directional communication. In general, wireless device 1100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 11, transmitter 1130 and receiver 1150 are implemented with the direct-conversion architecture.

In the transmit path, data processor 1110 processes data to be transmitted and provides I and Q analog output signals to transmitter 1130. Within transmitter 1130, lowpass filters 1132a and 1132b filter the I and Q analog output signals, respectively, to remove undesired images caused by the prior digital-to-analog conversion. Amplifiers (Amp) 1134a and 1134b amplify the signals from lowpass filters 1132a and 1132b, respectively, and provide I and Q baseband signals. An upconverter 1140 upconverts the I and Q baseband signals with I and Q transmit (TX) local oscillating (LO) signals from a TX LO signal generator 1170 and provides an upconverted signal. A filter 1142 filters the upconverted signal to remove undesired images caused by the frequency upconversion as well as noise in a receive frequency band. A power amplifier (PA) 1144 amplifies the signal from filter 1142 to obtain the desired output power level and provides a transmit RF signal. The transmit RF signal is routed through a duplexer or switch 1146 and transmitted via an antenna 1148.

In the receive path, antenna 1148 receives signals transmitted by base stations and provides a received RF signal, which is routed through duplexer or switch 1146 and provided to a low noise amplifier (LNA) 1152. The received RF signal is amplified by LNA 1152 and filtered by a filter 1154 to obtain a desirable RF input signal. A downconverter 1160 downconverts the RF input signal with I and Q receive (RX) LO signals from an RX LO signal generator 1180 and provides I and Q baseband signals. The I and Q baseband signals are amplified by amplifiers 1162a and 1162b and further filtered by lowpass filters 1164a and 1164b to obtain I and Q analog input signals, which are provided to data processor 1110.

TX LO signal generator 1170 generates the I and Q TX LO signals used for frequency upconversion. RX LO signal generator 1180 generates the I and Q RX LO signals used for frequency downconversion. Each LO signal is a periodic signal with a particular fundamental frequency. A PLL 1172 receives timing information from data processor 1110 and generates a control signal used to adjust the frequency and/or phase of the TX LO signals from LO signal generator 1170. Similarly, a PLL 1182 receives timing information from data processor 1110 and generates a control signal used to adjust the frequency and/or phase of the RX LO signals from LO signal generator 1180.

FIG. 11 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 11. Furthermore, other circuit blocks not shown in FIG. 11 may also be used to condition the signals in the transmitter and receiver. Some circuit blocks in FIG. 11 may also be omitted. All or a portion of transceiver 1120 may be implemented on one or more analog integrated circuits (ICs), RF ICs (RFICs), mixed-signal ICs, etc.

LO signal generators 1170 and 1180 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider. In certain exemplary embodiments, the VCO signal may have an adjustable duty cycle. The techniques of the present disclosure may be readily applied to the design of a VCO having such an adjustable duty cycle in the wireless communication device 1100.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for generating a periodic digital signal having a selectable duty cycle determined using a reference signal and an oscillator signal, the oscillator signal having a period shorter than that of the reference signal, the apparatus comprising:

a computation block configured to determine a computed target cycle count, the computed target cycle count corresponding to the result of multiplying a selected duty cycle with a ratio between the periods of the reference signal and the oscillator signal; and a pulse width generator configured to generate an output signal having a pulse width corresponding to the computed target cycle count times the period of the oscillator signal.

2. The apparatus of claim 1, the computation block comprising:

an integer counter configured to count an integer number of cycles elapsing in the oscillator signal during one period of the reference signal;

a latch configured to latch the integer number of cycles counted; and a computation unit for determining the result of multiplying the output of the latch with the selected duty cycle.

3. The apparatus of claim 2, the computation unit comprising a multiplier for multiplying the output of the latch with the selected duty cycle.

4. The apparatus of claim 1, the computation block comprising:

a first divider configured to divide the frequency of the reference signal by a first integer to generate a divided reference signal;

a second divider configured to divide the frequency of the oscillator signal by a second integer to generate a divided oscillator signal;

an integer counter configured to count an integer number of cycles elapsing in the divided oscillator signal during one period of the divided reference signal; and a latch configured to latch the integer number of cycles counted.

5. The apparatus of claim 4, the integer counter further configured to start counting based on a rising edge of the divided reference signal, the integer counter further configured to stop counting based on a falling edge of the divided reference signal, the latch further configured to latch the integer number of cycles counted on the falling edge of the divided reference signal.

6. The apparatus of claim 5, the computation block further comprising a re-timing block configured to synchronize the divided reference signal with the divided oscillator signal.

7. The apparatus of claim 1, the pulse width generator comprising:

a toggle integer counter configured to count an integer number of cycles elapsing in the oscillator signal during one period of the reference signal, the toggle integer counter configured to generate a signal edge when the counted number of cycles reaches the computed target cycle count.

8. The apparatus of claim 7, the toggle integer counter further configured to be reset once during each cycle of the reference signal.

9. An apparatus for generating a periodic digital signal having a selectable duty cycle determined using a reference signal and an oscillator signal, the oscillator signal having a period shorter than that of the reference signal, the apparatus comprising:

a computation block configured to determine a computed target cycle count, the computation block comprising:

a first divider configured to divide the frequency of the reference signal by a first integer to generate a divided reference signal, the first integer equal to a third integer times an integer power of two;

a second divider configured to divide the frequency of the oscillator signal by a second integer to generate a divided oscillator signal, the selected duty cycle corresponding to a ratio of the third integer to the second integer;

an integer counter configured to count an integer number of cycles elapsing in the divided oscillator signal during one period of the divided reference signal; and a latch configured to latch the integer number of cycles counted, an upper bit portion of the latched number corresponding to the integer portion of the computed target cycle count, a lower bit portion of the latched number corresponding to the fractional portion of the computed target cycle count; the apparatus further comprising:

a pulse width generator configured to generate an output signal having a pulse width corresponding to the computed target cycle count times the period of the oscillator signal.

10. The apparatus of claim 9, the computation block further comprising a re-timing block configured to synchronize the divided reference signal with the divided oscillator signal.

11. The apparatus of claim 9, the pulse width generator comprising:

a toggle integer counter configured to count an integer number of cycles elapsing in the oscillator signal during one period of the reference signal, the toggle integer counter configured to generate a signal edge when the counted integer number of cycles reaches the integer portion of the computed target cycle count;

a variable fractional delay unit configured to delay the generated signal edge by a fractional delay, the fractional delay comprising a fractional portion of the period of the oscillator signal, the fractional portion of the period of the oscillator signal corresponding to the fractional portion of the computed target cycle count; and a pulse width aggregator configured to generate a pulse having a first signal edge corresponding to an edge in the reference signal, and a complementary signal edge corresponding to the delayed generated signal edge, the generated pulse corresponding to the output signal of the apparatus.

12. The apparatus of claim 11, the pulse width aggregator comprising a D-Q flip-flop, the D input of the flip-flop coupled to a logical HIGH signal, the Reset signal of the flip-flop coupled to the reference signal, the clock signal of the flip-flop coupled to the delayed generated signal edge, the QB output of the flip-flop corresponding to the generated pulse of the pulse width aggregator.

13. The apparatus of claim 12, the oscillator signal being generated by a ring oscillator comprising a plurality of inverter stages, the variable fractional delay unit comprising a plurality of inverter stages matched to the inverter stages of the ring oscillator.

14. A method for generating a periodic digital signal having a selectable duty cycle determined using a reference signal and an oscillator signal, the oscillator signal having a period shorter than that of the reference signal, the method comprising:

computing a target cycle count, the computed target cycle count corresponding to the result of multiplying a selected duty cycle with a ratio between the periods of the reference signal and the oscillator signal; and generating a periodic output signal having a pulse width corresponding to the computed target cycle count times the period of the oscillator signal.

15. The method of claim 14, the computing comprising:

counting an integer number of cycles elapsing in the oscillator signal during one period of the reference signal; and multiplying the output of the latch with the selected duty cycle.

16. The method of claim 14, the computing comprising:

dividing the frequency of the reference signal by a first integer to generate a divided reference signal;

dividing the frequency of the oscillator signal by a second integer to generate a divided oscillator signal; and counting an integer number of cycles elapsing in the divided oscillator signal during one period of the divided reference signal.

17. The method of claim 16, the computing further comprising synchronizing the divided reference signal with the divided oscillator signal.

18. The method of claim 14, the generating comprising:

counting an integer number of cycles elapsing in the oscillator signal during one period of the reference signal; and generating an output signal edge when the counted number of cycles reaches the computed target cycle count.

19. The method of claim 18, further comprising resetting the output signal once during each cycle of the reference signal.

20. A method for generating a periodic digital signal having a selectable duty cycle determined using a reference signal and an oscillator signal, the oscillator signal having a period shorter than that of the reference signal, the method comprising:

computing a target cycle count, the computing comprising:

dividing the frequency of the reference signal by a first integer to generate a divided reference signal, the first integer equal to a third integer times an integer power of two;

dividing the frequency of the oscillator signal by a second integer to generate a divided oscillator signal, the selected duty cycle corresponding to a ratio of the third integer to the second integer;

counting an integer number of cycles elapsing in the divided oscillator signal during one period of the divided reference signal; and latching the integer number of cycles counted, an upper bit portion of the latched number corresponding to the integer portion of the computed target cycle count, a lower bit portion of the latched number corresponding to the fractional portion of the computed target cycle count; the method further comprising:

generating an output signal having a pulse width corresponding to the computed target cycle count times the period of the oscillator signal.

21. The method of claim 20, the computing further comprising synchronizing the divided reference signal with the divided oscillator signal.

22. The method of claim 20, the generating comprising:

counting an integer number of cycles elapsing in the oscillator signal during one period of the reference signal;

generating a signal edge when the counted integer number of cycles reaches the integer portion of the computed target cycle count;

delaying the generated signal edge by a fractional delay, the fractional delay comprising a fractional portion of the period of the oscillator signal, the fractional portion of the period of the oscillator signal corresponding to the fractional portion of the computed target cycle count; and generating a pulse having a first signal edge corresponding to an edge in the reference signal, and a complementary signal edge corresponding to the delayed generated signal edge, the generated pulse corresponding to the output signal of the apparatus.

23. The method of claim 22, the fractional delay further comprising an extended compensation delay.

24. The method of claim 22, the generating a pulse comprising:

sampling a logical HIGH signal on a rising edge of the delayed generated signal; and resetting the pulse on a rising edge of the reference signal.

25. An apparatus for generating a periodic digital signal having a selectable duty cycle determined using a reference signal and an oscillator signal, the oscillator signal having a period shorter than that of the reference signal, the apparatus comprising:

means for computing a target cycle count, the computed target cycle count corresponding to the result of multiplying a selected duty cycle with a ratio between the periods of the reference signal and the oscillator signal; and means for generating a periodic output signal having a pulse width corresponding to the computed target cycle count times the period of the oscillator signal.

26. A device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX LO and RX LO signal generator comprising a variable duty cycle generator for generating a signal having a selectable duty cycle determined using a reference signal and an oscillator signal, the oscillator signal having a period shorter than that of the reference signal, the duty cycle generator comprising:

a computation block configured to determine a computed target cycle count, the computed target cycle count corresponding to the result of multiplying a selected duty cycle with a ratio between the periods of the reference signal and the oscillator signal; and a pulse width generator configured to generate an output signal having a pulse width corresponding to the computed target cycle count times the period of the oscillator signal.

* * * * *